(12) United States Patent
Arimatsu

(10) Patent No.: US 8,987,977 B2
(45) Date of Patent: Mar. 24, 2015

(54) PIEZOELECTRIC VIBRATION REED, PIEZOELECTRIC VIBRATOR, OSCILLATOR, ELECTRONIC INSTRUMENT, AND RADIO TIMEPIECE

(71) Applicant: Seiko Instruments Inc., Chiba-shi, Chiba (JP)

(72) Inventor: Daishi Arimatsu, Chiba (JP)

(73) Assignee: SII Crystal Technology Inc., Chiba (JP)

( * ) Notice: Subject to any disclaimer, the term of this patent is extended or adjusted under 35 U.S.C. 154(b) by 307 days.

(21) Appl. No.: 13/629,283

(22) Filed: Sep. 27, 2012

(65) Prior Publication Data
US 2013/0076211 A1 Mar. 28, 2013

(30) Foreign Application Priority Data
Sep. 28, 2011 (JP) ................................ 2011-213019

(51) Int. Cl.
H03H 9/21 (2006.01)
G04R 20/10 (2013.01)
H03H 9/05 (2006.01)
H03H 9/10 (2006.01)

(52) U.S. Cl.
CPC ................. *G04R 20/10* (2013.01); *H03H 9/21* (2013.01); *H03H 9/0595* (2013.01); *H03H 9/1021* (2013.01)
USPC ........................................................ 310/370

(58) Field of Classification Search
CPC ................................. H03H 9/21; H03H 9/215
USPC ............................ 310/370; 331/156; 333/200
See application file for complete search history.

(56) References Cited

U.S. PATENT DOCUMENTS

| | | | |
|---|---|---|---|
| 6,724,271 B2* | 4/2004 | Sakata et al. ................... | 331/156 |
| 7,112,915 B2* | 9/2006 | Tanaya et al. .................. | 310/370 |
| 7,211,936 B2* | 5/2007 | Tanaya et ....................... | 310/370 |
| 7,253,554 B2 | 8/2007 | Dalla Piazza et al. | |
| 7,535,159 B2* | 5/2009 | Kizaki ........................... | 310/370 |
| 7,932,664 B2* | 4/2011 | Yamazaki et al. ............. | 310/370 |
| 8,102,103 B2 | 1/2012 | Furuhata et al. | |
| 8,432,087 B2* | 4/2013 | Yamada et al. ................ | 310/370 |
| 2012/0195170 A1* | 8/2012 | Kobayashi ...................... | 368/47 |
| 2014/0078870 A1* | 3/2014 | Kobayashi ...................... | 368/47 |
| 2014/0111065 A1* | 4/2014 | Kobayashi ..................... | 310/370 |

FOREIGN PATENT DOCUMENTS

JP 2009-081520 4/2009

OTHER PUBLICATIONS

Office Action for U.S. Appl. No. 14/024,857 dated Sep. 30, 2014, 9 pages.

* cited by examiner

*Primary Examiner* — J. San Martin
(74) *Attorney, Agent, or Firm* — Brinks Gilson & Lione

(57) ABSTRACT

There is provided a piezoelectric vibration reed including a pair of vibrating arm portions arranged in parallel to each other and a base portion integrally fixing proximal end portions in the longitudinal direction of the pair of vibrating arm portions, wherein the pair of vibrating arm portions is formed with first groove portions positioned on the side of the proximal end portions of the vibrating arm portions and second groove portions positioned on the side of distal end portions of the vibrating arm portions with respect to the first groove portions on main surfaces, the width of the first groove portions along the width direction orthogonal to the longitudinal direction of the vibrating arm portions on the main surfaces of the vibrating arm portions is formed to be smaller than the second groove portions, and reinforcing ribs projecting from bottom surfaces of the second groove portions are formed in the second groove portions.

14 Claims, 14 Drawing Sheets

PIEZOELECTRIC VIBRATION REED, PIEZOELECTRIC VIBRATOR, OSCILLATOR, ELECTRONIC INSTRUMENT, AND RADIO TIMEPIECE

RELATED APPLICATIONS

This application claims priority under 35 U.S.C. §119 to Japanese Patent Application No. 2011-213019 filed on Sep. 28, 2011, the entire content of which is hereby incorporated by reference.

BACKGROUND OF THE INVENTION

1. Technical Field

The present invention relates to a piezoelectric vibration reed, a piezoelectric vibrator, an oscillator, an electronic instrument, and a radio timepiece.

2. Description of the Related Art

In mobile phones or portable information terminal equipment, a piezoelectric vibrator using crystal or the like is employed as a timing source or a reference signal source of a time-of-day source or a control signal. Various types of the piezoelectric vibrators of this type are provided, and as one of these piezoelectric vibrators, a piezoelectric vibrator having so-called a tuning-fork-type piezoelectric vibration reed is known.

The tuning-fork-type vibration reed includes a pair of vibrating arm portions disposed in parallel and a base portion configured to support proximal end portions of the pair of vibrating arm portions.

Then, an electrode film is formed on the surface of the piezoelectric vibration reed, and when a voltage is applied to the electrode film, the pair of vibrating arm portions can be brought into vibrations at a predetermined resonant frequency in the directions toward and away from each other.

In recent years, downsizing of the piezoelectric vibration reed is desired in association with downsizing of equipment having the piezoelectric vibrator mounted thereon.

However, when the width of the vibrating arm portions is reduced for example, the width of the electrode films (excitation electrodes) formed on the vibrating arm portions is also reduced. Consequently, the equivalent series resistance value thereof (the CI (Crystal Impedance) value) is increased, and the quality of an output signal may be deteriorated.

A resonant frequency F of the vibrations of the pair of vibrating arm portions is expressed by:

$$F=k(W/L2)$$

(k: coefficient, W: width of the vibrating arm portions, L: length of the vibrating arm portions). Therefore, when the length or the width of the vibrating arm portions is changed, the resonant frequency F may be shifted. Therefore, in order to achieve downsizing of the piezoelectric vibration reed, attention should be paid so as not to cause the resonant frequency to be shifted.

Therefore, formation of groove portions on upper and lower surfaces of the vibrating arm portions is known when reducing the width of the vibrating arm portions (see JP-A-2009-81520). When the grove portions are formed, the excitation electrodes in pair oppose each other between both sides of the groove portions. Therefore, efficient action of an electrical field in the opposing direction is achieved. Accordingly, enhancement of the electrical field efficiency is achieved even when the width of the vibrating arm portions is reduced, so that downsizing is achieved while improving the quality.

However, when the groove portions are formed on the vibrating arm portions, rigidity of the vibrating arm portions may be lowered. In particular, when the groove portions are formed in the vicinity of connecting portions between the proximal end portions of the vibrating arm portions and the base portion, a sufficient strength of the vibrating arm portions cannot be obtained and, in addition, a stress concentration on these portions may easily occur. Therefore, when an external impact or the like is applied on the piezoelectric vibration reed, the piezoelectric vibration reed is susceptible to breakage or the like starting from the portions in the vicinity of the connecting portions of the proximal end portions between the vibrating arm portions and the base portion.

The electric field efficiency is improved in proportion to the increase in width of the groove portions when the width of the vibrating arm portions is the same. In contrast, however, the larger the width of the groove portions, the more the rigidity of the vibrating arm portions in the direction of distortion or the direction of thickness thereof is decreased, so that the vibrating arm portions are susceptible to deformation. Consequently, the vibrations might be excited in a vibration mode different from a desired vibration mode, which may results in deterioration of the quality of the output signal.

SUMMARY OF THE INVENTION

Accordingly, it is an object of the invention to provide a piezoelectric vibration reed which achieves downsizing while inhibiting lowering of the rigidity and prevention of deterioration of the quality of an output signal, a piezoelectric vibrator, an oscillator, an electronic instrument, and a radio timepiece having the same.

In order to solve the problems as described above, the invention employs following means.

A piezoelectric vibration reed including: a pair of vibrating arm portions arranged in parallel to each other and a base portion integrally fixing proximal end portions in the longitudinal direction of the pair of vibrating arm portions, wherein the pair of vibrating arm portions is formed with first groove portions positioned on the side of the proximal end portions of the vibrating arm portions and second groove portions positioned on the side of distal end portions of the vibrating arm portions with respect to the first groove portions on main surfaces, the width of the groove portions along the width direction orthogonal to the longitudinal direction of the vibrating arm portions on the main surfaces of the vibrating arm portions is formed to be smaller than the second groove portions, and reinforcing ribs projecting from bottom surfaces of the second groove portions are formed in the second groove portions.

According to the invention, the width of the first groove portions formed on the side of the proximal end portions of the vibrating arm portions are formed to be smaller than that of the second groove portions. Therefore, rigidity of the vibrating arm portions on the proximal end portions may be enhanced. Accordingly, concentration of a stress on the proximal end portions of the vibrating arm portions can be inhibited. Since the reinforcing ribs are formed in the second groove portions, the rigidity of the vibrating arm portions in the thickness direction or the direction of distortion is improved.

Therefore, lowering of the rigidity of the entire vibrating arm portions may be inhibited, and generation of unnecessary vibrations of the vibrating arm portions may be prevented. Therefore, breakage or the like of the piezoelectric vibration reed is prevented and high reliability is obtained and generation of the unnecessary vibrations (vibrations in vibrations modes different from that of a desired vibration mode) are inhibited while achieving downsizing of the vibrating arm portion, so that deterioration of quality of the output signal can be inhibited.

In the piezoelectric vibration reed of the invention, it is preferable that the first groove portions are formed to be shorter along the longitudinal direction of the vibrating arm portions than the second grooves.

In this case, enhancement of the rigidity of the proximal end portions of the vibrating arm portions is facilitated, and the concentration of the stress on the proximal end potions of the vibrating arm portions can be inhibited.

In the piezoelectric vibration reed of the invention, it is preferable that the first groove portions and the second groove portions are formed along the longitudinal direction of the vibrating arm portions each with a partitioning wall interposed therebetween, and the partitioning walls are provided so as to be inclined from the side of the distal end portions toward the proximal end portion of the vibrating arm portions along the width direction of the vibrating arm portions.

In this case, since the partitioning walls have not only a component in the width direction but also in the longitudinal direction, a reinforcing component with respect to vibrations in the thickness direction of the vibrating arm portions is ensured. Therefore, the vibrating arm portions can be effectively inhibited from vibrating in the thickness direction and inhabitation of generation of the unnecessary vibrations is achieved further easily.

In the piezoelectric vibration reed of the invention, it is preferable that the reinforcing ribs are formed to extend along the longitudinal direction of the vibrating arm portions in the second groove portions so as to connect ends on the side of the proximal end portions of the vibrating arm portions and the other ends on the side of the distal end portions of the vibrating arm portions in the second groove portions.

In the piezoelectric vibration reed of the invention, it is preferable that the reinforcing ribs are provided intermittently along the longitudinal direction of the vibrating arm portions in the second groove portions.

In the piezoelectric vibration reed of the invention, it is preferable that the reinforcing ribs extend in the width direction in the second groove portions so as to bridge the second groove portions in the width direction of the vibrating arm portions.

In this case, the rigidity of the vibrating arm portions in the thickness direction or the direction of distortion is further improved by the reinforcing ribs. In particular, by changing the length, the distance, and the modes of provision of the reinforcing rib, the rigidity of the vibrating arm portions may be adjusted as needed.

According to a second aspect of the invention, there is provided a piezoelectric vibrator including the piezoelectric vibration reed of the invention.

In this configuration, since the piezoelectric vibration reed of the invention is provided, the piezoelectric vibrator having a high strength and high performance can be provided. Therefore, the high reliability and the high vibrating property can be obtained while downsizing the piezoelectric vibrator.

According to a third aspect of the invention, there is provided an oscillator wherein the piezoelectric vibrator of the invention is electrically connected to an integrated circuit as an oscillating element.

According to a fourth aspect of the invention, there is provided an electronic instrument wherein the piezoelectric vibrator of the invention is electrically connected to a clocking unit.

According to a fifth aspect of the invention, there is provided a radio timepiece wherein the piezoelectric vibrator of the invention is electrically connected to a filter portion.

In this configuration, since the piezoelectric vibrator of the invention is provided, the oscillator, the electronic instrument, and the radio timepiece having high reliability and high performance is provided.

According to the invention, downsizing is achieved while inhibiting lowering of rigidity, and lowering of the quality of the output signal is achieved.

Figure 1:
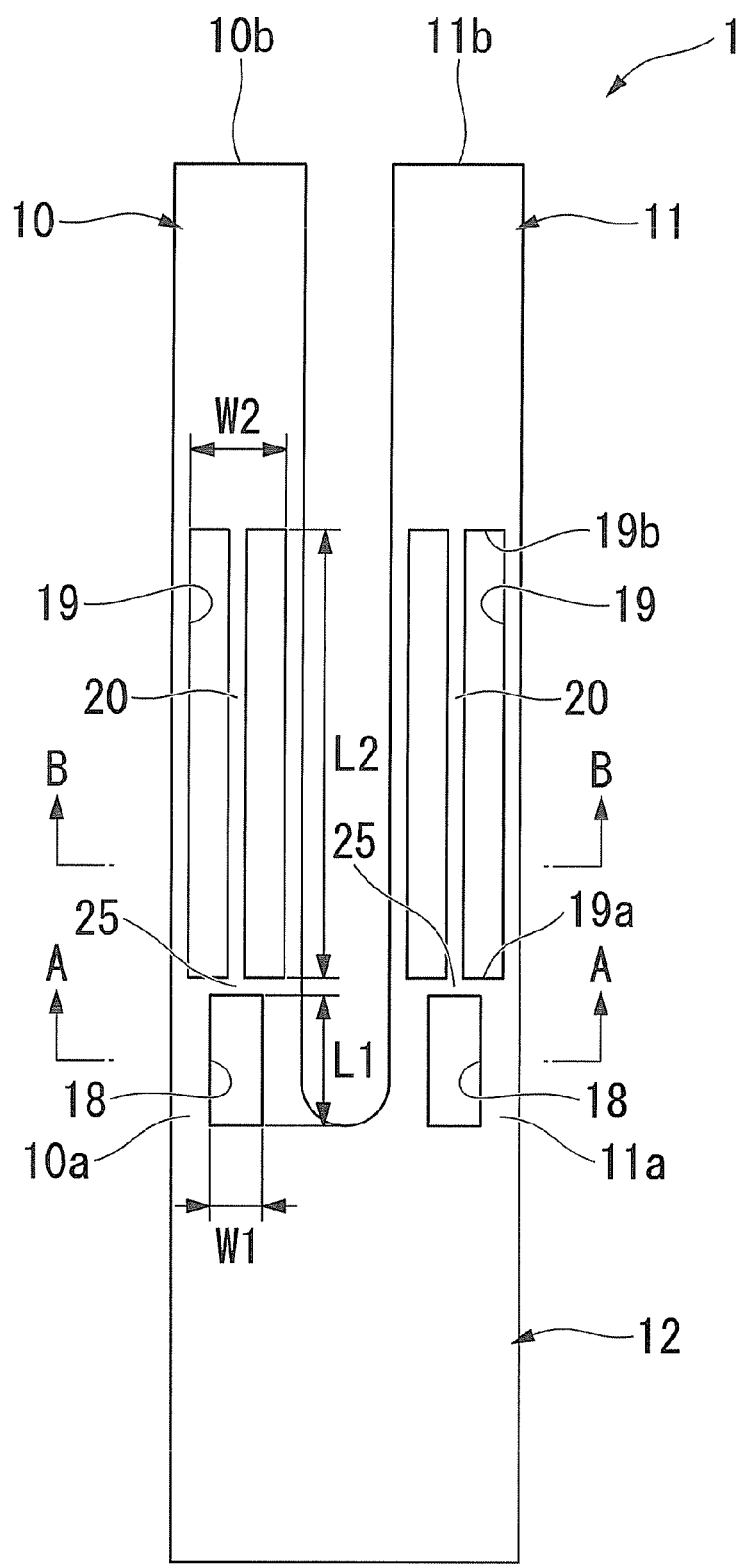
FIG. 1 is an upper view of a piezoelectric vibration reed.

DESCRIPTION OF THE PREFERRED
EMBODIMENTS

Referring now to the drawings, best modes for implementing a piezoelectric vibration reed, a piezoelectric vibrator, an oscillator, an electronic instrument, and a radio timepiece in the invention will be described. However, the invention is not limited to these embodiments.

(Piezoelectric Vibration Reed)

Figure 2A:
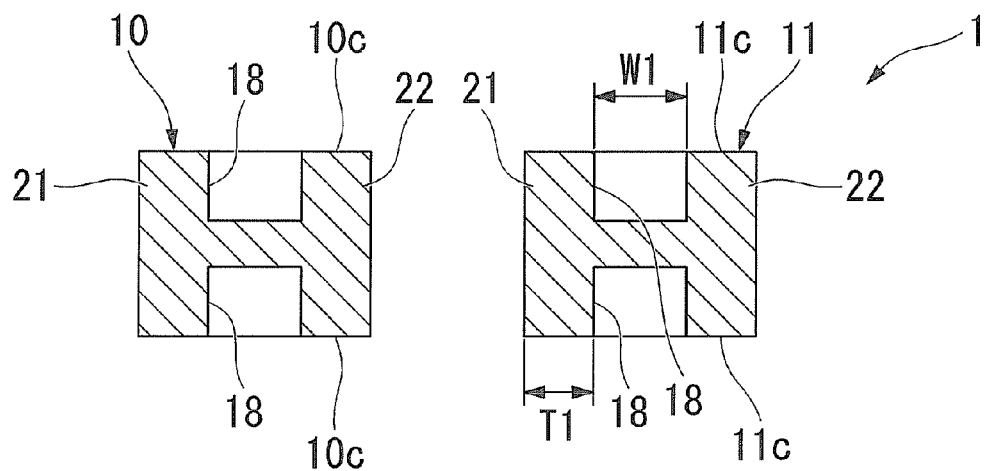
FIG. 2A is a cross-sectional view of the piezoelectric vibration reed taken along the line A-A in FIG. 1.

As shown in FIG. 1 and FIG. 2, a piezoelectric vibration reed 1 is a turning-fork-type vibration reed formed of a piezoelectric material such as crystal, lithium tantalate, or lithium niobate, and includes a pair of vibrating arm portions 10 and 11 arranged so as to extend in parallel to each other and a plate-shaped base portion 12 configured to integrally fix proximal end side of the pair of vibrating arm portions 10 and 11.

The pair of vibrating arm portions 10 and 11 are formed with excitation electrodes, not shown, configured to vibrate the pair of vibrating arm portions 10 and 11 on an outer surfaces thereof. The base portion 12 is formed with mount electrodes, not shown, on an outer surface thereof, and are connected to the excitation electrodes by a drawing electrode, not shown.

When a predetermined voltage is applied to the respective electrodes, the vibrating arm portions 10 and 11 vibrate at a predetermined resonant frequency in the direction toward and away from each other (the widthwise direction) by the mutual action between the excitation electrodes of both of the vibrating arm portions 10 and 11.

Also, the piezoelectric vibration reed 1 according to this embodiment is provided with groove portions (first groove portions) 18 and groove portions (second groove portions) 19 formed respectively along the longitudinal direction of the vibrating arm portions 10 and 11 on main surfaces 10c and 11c of the pair of vibrating arm portions 10 and 11 (in the direction connecting proximal end portions 10a and 11a and distal end portions 10b and 11b of the vibrating arm portions 10 and 11). The groove portions 18 and the groove portions 19 are formed along the longitudinal direction of the vibrating arm portions 10 and 11 with wall portions (partitioning walls) 25 interposed therebetween.

The groove portions 18 are arranged in the vicinity of joint portions between the proximal end portions 10a and 11a of the vibrating arm portions 10 and 11 and the base portion 12. In contrast, the groove portions 19 are arranged on the side of the distal end portions 10b and 11b of the vibrating arm portions 10 and 11 with respect to the groove portions 18, and are formed from positions proximity to the groove portions 18 to positions near midpoints of the vibrating arm portions 10 and 11 with the wall portions 25 interposed therebetween.

The groove portions 18 are formed to have a width (the width orthogonal to the direction of the length of the vibrating arm portions 10 and 11 on the main surfaces 10c and 11c of the vibrating arm portions 10 and 11) W1 smaller than a width W2 of the groove portions 19. Accordingly, a width T1 of wall portions 21 and 22 on both sides of the groove portions 18 is set to be larger than a width T2 of wall portions 23 and 24 on both sides of the groove portions 19. Accordingly, the rigidity of the proximal end portions 10a and 11a of the vibrating arm portions 10 and 11 each formed with the groove portions 18 is set to be higher than that of the areas formed with the groove portions 19.

The groove portions 18 are formed so that the length L1 along the longitudinal direction of the vibrating arm portions 10 and 11 is smaller than a length L2 of the groove portions 19.

A reinforcing rib 20 is formed continuously in the midpoints of each of the groove portions 19 in the width direction so as to extend in the direction connecting one ends 19a and other ends 19b in the longitudinal direction of the groove portions 19. More specifically, the reinforcing ribs 20 are formed so as to extend along the longitudinal direction of the vibrating arm portions 10 and 11 in the groove portions 19 as projecting ridges and connect the one ends 19a and the other ends 19b in the longitudinal direction of the groove portions 19. Then, the reinforcing ribs 20 project from bottom surfaces of the groove portions 19 in the direction of the thickness of the vibrating arm portions 10 and 11, and are formed to have the same height H as the wall portions 23 and 24 on the both sides of the groove portions 19. Accordingly, upper and lower end surfaces 20a of the reinforcing ribs 20 are flush with the main surfaces 10c and 11c of the vibrating arm portions 10 and 11.

Figure 2B:
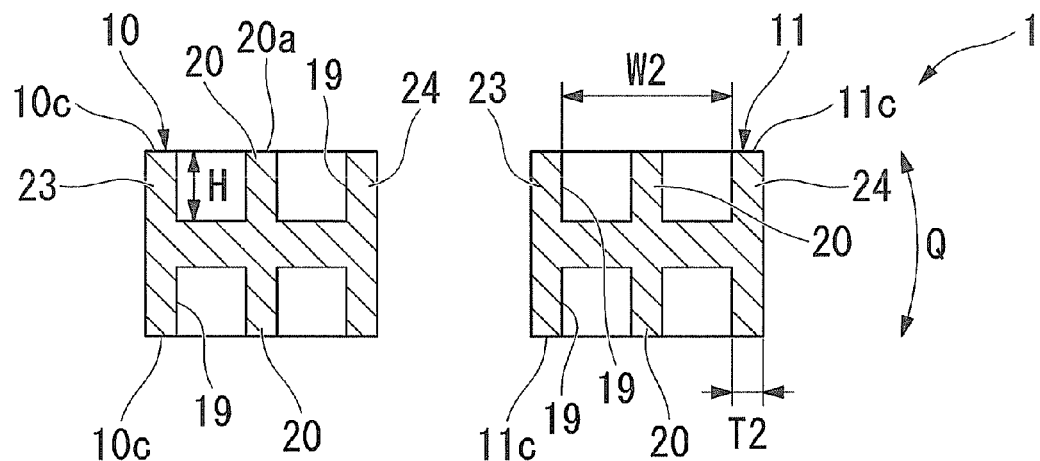
FIG. 2B is a cross-sectional view of the piezoelectric vibration reed taken along the line B-B in FIG. 1.

With the provision of the reinforcing ribs 20 as described above, the rigidity of the portions of the vibrating arm portions 10 and 11 where the groove portions 19 are formed is improved in the direction of thickness (the direction orthogonal to the direction in which the vibrating arm portions 10 and 11 are aligned adjacent to each other: the direction indicated by an arrow P in FIG. 2B) and the direction of distortion (the direction around center axes of the vibrating arm portions 10 and 11: the direction indicated by an arrow Q in FIG. 2B), so that generation of vibrations due to unnecessary deformation may be restrained.

Effect of Embodiment

In the piezoelectric vibration reed 1 as described above, since the groove portions 18 formed on the proximal end portions 10a and 11a of the vibrating arm portions 10 and 11 are formed to be smaller in the width W1 and the length L1 than the groove portions 19 formed on the side of the distal end portions 10b and 11b with respect to the groove portions 18, the rigidity of the proximal end portions 10a and 11a of the vibrating arm portions 10 and 11 may be enhanced. Accordingly, the stress can be prevented from concentrating on the proximal end portions 10a and 11a of the vibrating arm portions 10 and 11, and the occurrence of breakage or the like of the piezoelectric vibration reed 1 is prevented even when an external impact or the like is applied to the piezoelectric vibration reed 1.

Since the groove portions 19 formed in the midpoints of the vibrating arm portions 10 and 11 in the longitudinal direction are provided with the reinforcing ribs 20, the rigidity of the vibrating arm portions 10 and 11 in the thickness direction P or the direction of distortion Q is improved. Accordingly, the generation of unnecessary vibrations on the vibrating arm portions 10 and 11 is prevented while enhancing the electrical field efficiency by the groove portions 19, and the excitation of the vibrations in a vibration mode different from the desired vibration mode is prevented, so that the deterioration of the quality of the output signal can be prevented.

Although the groove portions 18 and the groove portions 19 are formed along the longitudinal direction of the vibrating arm portions 10 and 11 with the wall portions 25 interposed therebetween in the embodiment described above, the groove portions 18 and the groove portions 19 may be formed along the longitudinal direction of the vibrating arm portions 10 and 11 so as to communicate with each other without the intermediary of the wall portions 25.

In this case as well, the same effects and advantages are achieved by setting the width W1 of the groove portions 18 to be smaller than the width W2 of the groove portions 19 and providing the reinforcing ribs 20 in the groove portions 19.

Modifications of the embodiment described above will be shown below. In the following description, a configuration different from the embodiment described above will mainly described, and the configuration common to the embodiment described above are designated by the same reference numerals in the drawings and description will be omitted.

First Modification of Embodiment

In the embodiment described above, the reinforcing ribs 20 are formed continuously in the longitudinal direction so as to connect the one ends 19a and the other ends 19b of the groove portions 19. However, the invention is not limited thereto.

Figure 3:
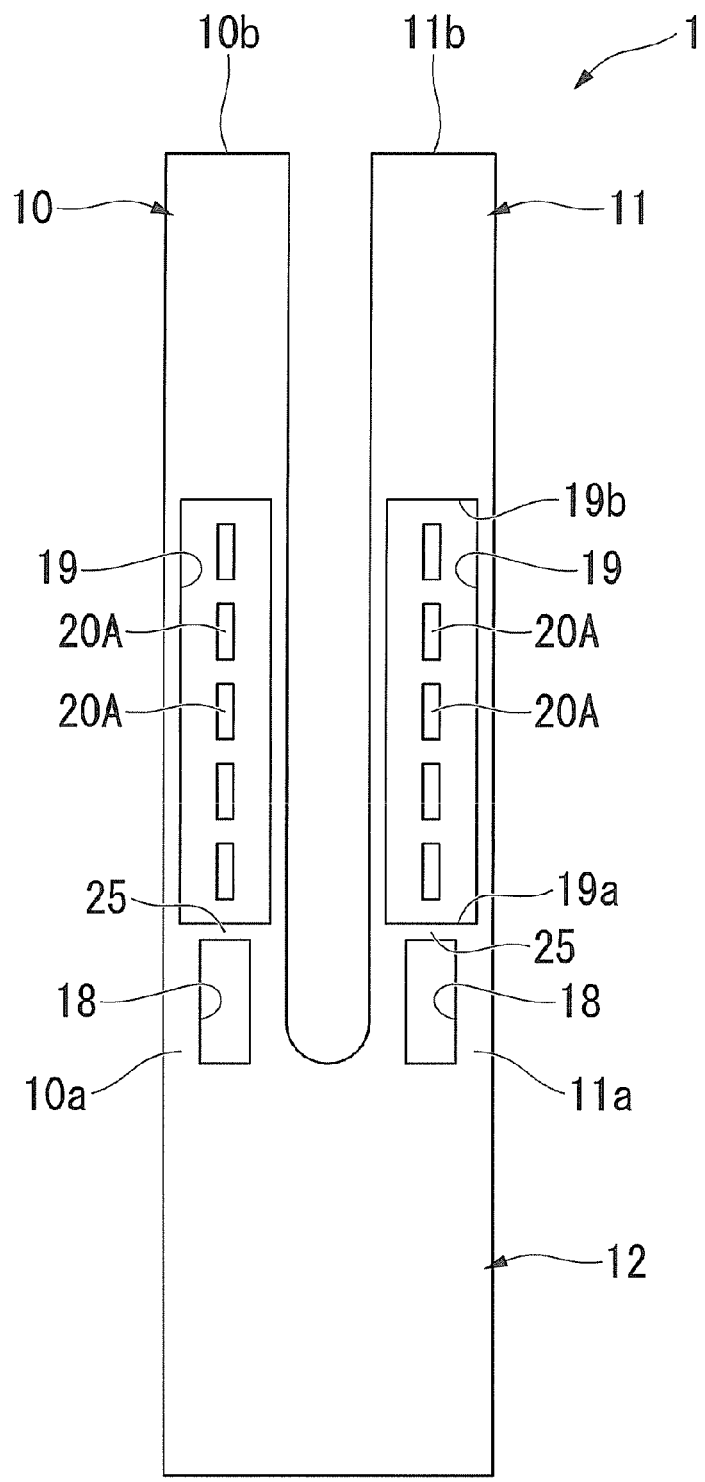
FIG. 3 is a drawing showing a first modification of the piezoelectric vibration reed, in which reinforcing ribs are provided intermittently in the longitudinal direction of second groove portions.

For example, as shown in FIG. 3, reinforcing ribs 20A may be arranged intermittently along the longitudinal direction between the one ends 19a and the other ends 19b of the groove portions 19.

In this configuration as well, the same effects as the embodiment described above may be obtained.

Alternatively, the reinforcing ribs 20 may be extended in a cantilevered manner so as to extend along the longitudinal direction from the one ends 19a and the other ends 19b so as to oppose each other instead of connecting the one ends 19a and the other ends 19b of the groove portions 19 completely by being fixed at both ends. In other words, in this case, the reinforcing ribs 20 are discontinued in the midpoints of the groove portions 19 and each of the groove portions 19 is formed into a substantially H-shape.

The height H of reinforcing ribs 20 and 20A are set to be the same as the height of the wall portions 23 and 24 on the both sides, a height lower than the wall portions 23 and 24 is also applicable.

The reinforcing ribs 20 are not limited to be formed along the longitudinal direction of the groove portions 19. However, the reinforcing ribs 20 may be formed along the width direction of the vibrating arm portions 10 and 11 connecting the wall portions 23 and 24 on the both sides so as to bridge the groove portions 19 along the width direction.

In this case, a plurality of the reinforcing ribs 20 bridging the groove portions 19 may be provided at intervals along the longitudinal direction. In addition, the reinforcing ribs 20 may be provided so as to intersect along the longitudinal direction and the width direction. Also, although the case in which the reinforcing ribs 20 are formed integrally with the vibrating arm portions 10 and 11 has been described in the embodiment described above, the invention is not limited thereto and the reinforcing ribs may be provided separately in the groove portions 19.

Second Modification of Embodiment

Although the wall portions 25 positioned between the groove portions 18 and the groove portions 19 extend in the width directions of the vibrating arm portions 10 and 11 in the embodiment described above, the invention is not limited thereto.

Figure 4:
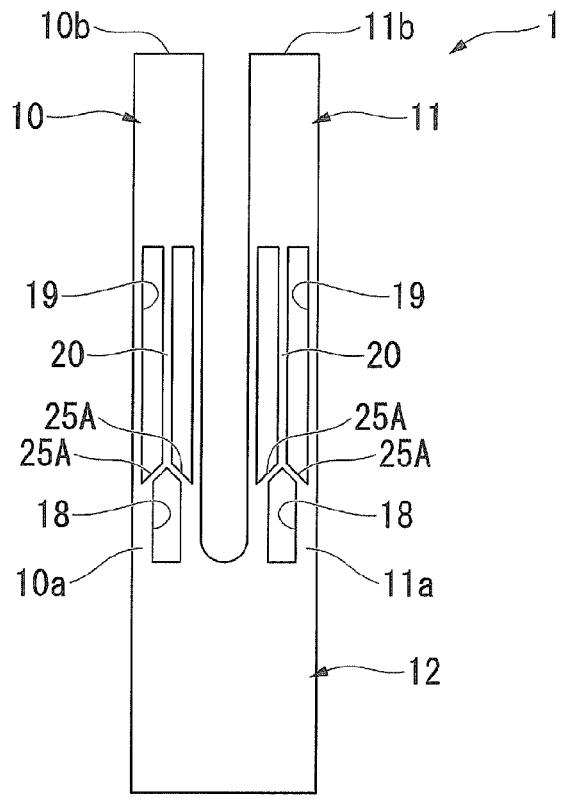
FIG. 4 is a drawing showing a second modification of the piezoelectric vibration reed, in which wall portions between first groove portions and the second groove portions are obliquely provided.

For example, as shown in FIG. 4, wall portions (partitioning walls) 25A positioned between the groove portions 18 and the groove portions 19 may be extended in the direction intersecting the width directions of the vibrating arm portions 10 and 11 on the main surfaces 10c and 11c of the vibrating arm portions 10 and 11. The wall portions 25A in this modification are inclined toward the distal end portions 10b and 11b along the longitudinal direction of the vibrating arm portions 10 and 11 as it goes the centers from the both sides in the width direction.

In this configuration, since the wall portions 25A have not only a component in the width direction but also in the longitudinal direction, a reinforcing component with respect to vibrations in the thickness direction of the vibrating arm portions 10 and 11 is ensured in comparison with a case where the wall portions 25 extend in the width direction as in the embodiment described above. Therefore, in this modification, since the wall portions 25A effectively contributes to reinforcement against the vibrations of the vibrating arm portions 10 and 11 in the thickness direction in addition to the reinforcing ribs 20, the unnecessary vibrations of the vibrating arm portions 10 and 11 are preferably inhibited.

The wall portions 25A may be formed so as to incline toward the proximal end portions 10a and 11a along the longitudinal direction of the vibrating arm portions 10 and 11 as it goes inward from both sides in the width direction.

Third Modification of Embodiment

Figure 5:
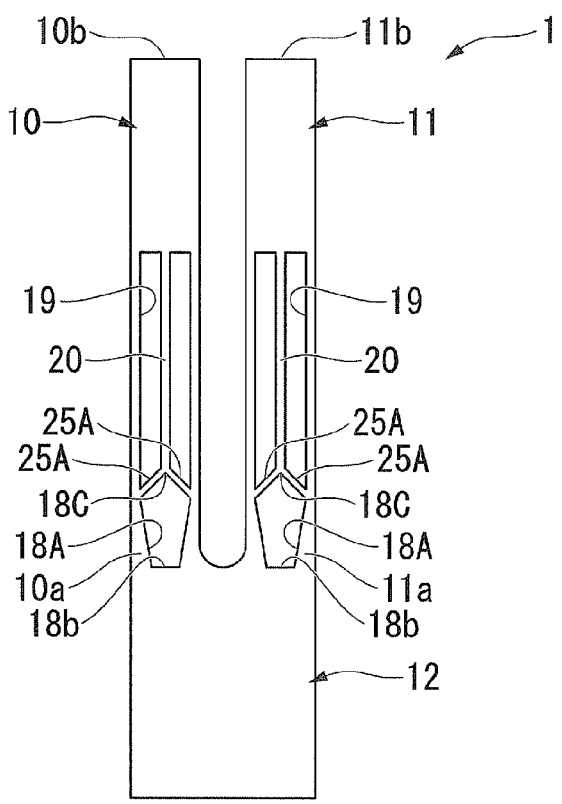
FIG. 5 is a drawing showing a third modification of the piezoelectric vibration reed, in which the width of the first groove portions is changed.

As shown in FIG. 5, in addition to the wall portions 25A as in the second modification shown above, groove portions (first groove portions) 18A may be formed in a tapered shape which is increased in width as it goes from end portions 18b on the side of the proximal end portions 10a and 11a of the vibrating arm portions 10 and 11 toward end portion 18c on the side of the distal end portions 10b and 11b.

In this configuration, by reducing the width of the groove portions 18A on the side of the end portions 18b on the side of the proximal end portions 10a and 11a of the vibrating arm portions 10 and 11, the rigidity of the vibrating arm portions 10 and 11 can be ensured. In contrast, by increasing the width of the groove portion 18A on the side of the distal end portions 10b and 11b, the electrical field efficiency is enhanced, and the performance can be improved.

Fourth Modification of Embodiment

Figure 6:
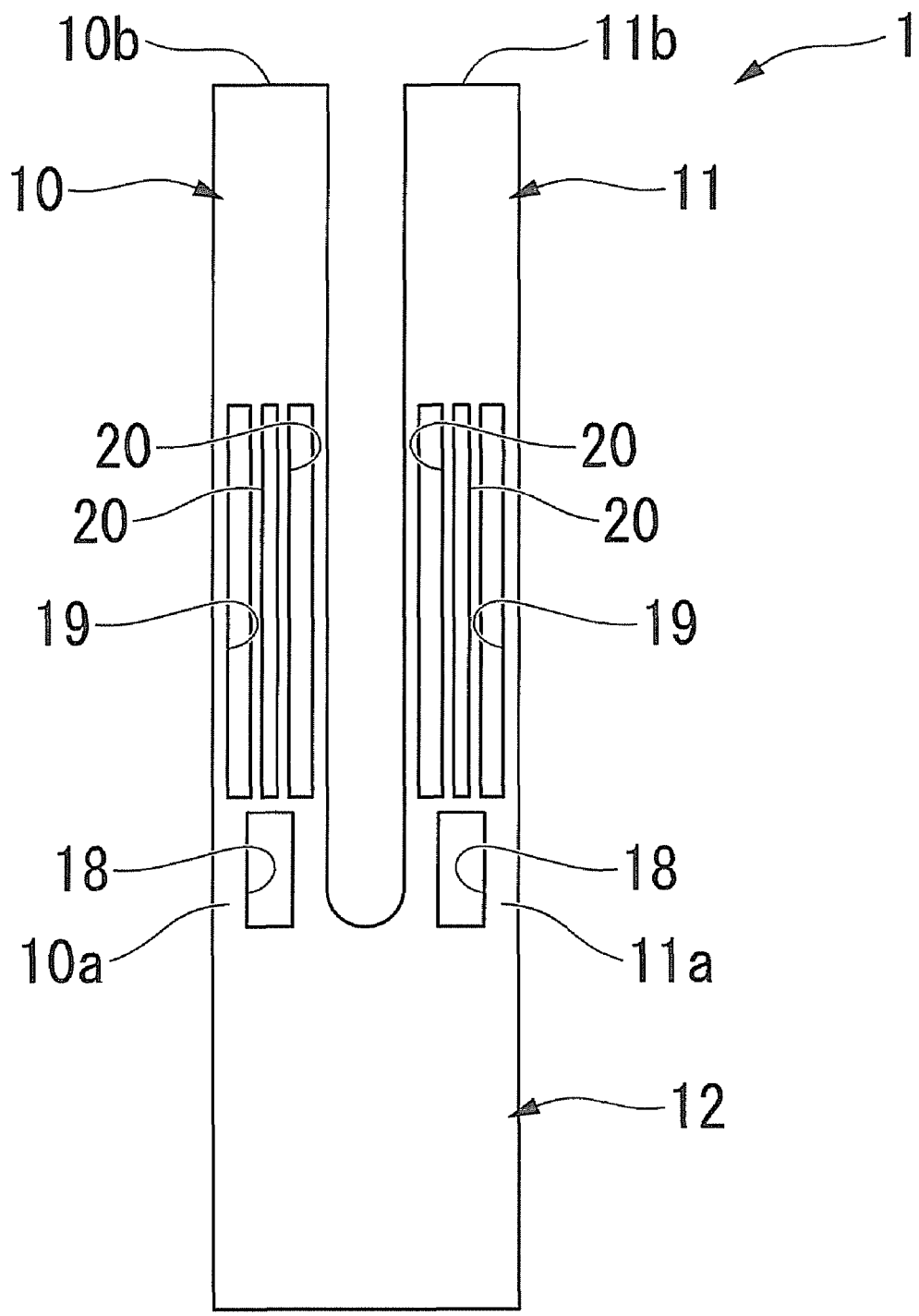
FIG. 6 is a drawing showing a fourth modification of the piezoelectric vibration reed, in which a plurality of the reinforcing ribs are provided.

As shown in FIG. 6, the groove portions 19 may also be provided with two reinforcing ribs 20. Accordingly, the rigidity of the vibrating arm portions 10 and 11 in the thickness direction and the direction of distortion may be enhanced in the midpoints of the vibrating arm portions 10 and 11 in the longitudinal direction, and the lowering of the quality of the output signal may further be inhibited further effectively. Furthermore, the two or more reinforcing ribs 20 may be provided.

Fifth Modification of Embodiment

Here, in order to achieve downsizing of the piezoelectric vibration reed 1, reduction of the length of the base portion 12 is effective. However, there arises a problem of occurrence of vibration leak (leak of vibration energy). In other words, when the length of the base portion 12 is reduced, the distance between the joint portion of the base portion 12 with respect to the vibrating arm portions 10 and 11 and a mount portion thereof mounted via a bump or the like, not shown, is reduced.

Then, the vibrations are not sufficiently attenuated in the base portion 12 and leak toward a package for example through the mount portion, which results of shifting of a resonant frequency F. Such a phenomenon is referred to as the vibration leak, and when such a leak of vibrations occurs, the loss at the time of conversion from an electric signal to mechanical vibrations is increased in addition to the problem of shifting of the resonant frequency F. Consequently, a CI value is increased and the problem of the deterioration of the quality also Occurs.

Figure 7:
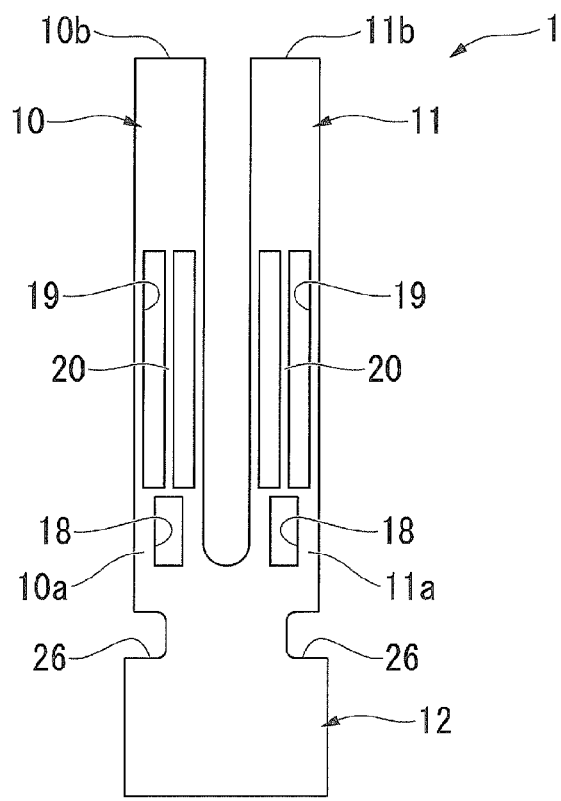
FIG. 7 is a drawing showing a fifth modification of the piezoelectric vibration reed, in which notches are formed on a base portion.

Accordingly, as shown in FIG. 7, the base portion 12 is preferably formed with notches 26 removed respectively from both side surfaces in the width direction toward the center in the width direction (so-called, a notch type) in the vicinity of connecting portions of the vibrating arm portions 10 and 11 with respect to the proximal end portions 10a and 11a.

The notches 26 open respectively outward in the width direction, and penetrate through the base portion 12 in the thickness direction. Therefore, in the base portion 12, a portion in the vicinity of the connecting portions of the vibrating arm portions 10 and 11 with respect to the proximal end portions 10a and 11a has a constricted shape which is a narrower portion having a smaller width in comparison with other portions.

With the narrower portion formed by the notches 26, a route through which the vibrations excited by the vibrating arm portions 10 and 11 are transmitted to the base portion 12 side can be narrowed, so that the vibrations are locked on the side of the vibrating arm portions 10 and 11 and are easily inhibited from leaking toward the base portion 12. Accordingly, the vibration leak can be effectively inhibited, and the CI value is prevented from increasing, whereby the deterioration of the quality of the output signal may be inhibited.

Sixth Modification of Embodiment

Figure 8:
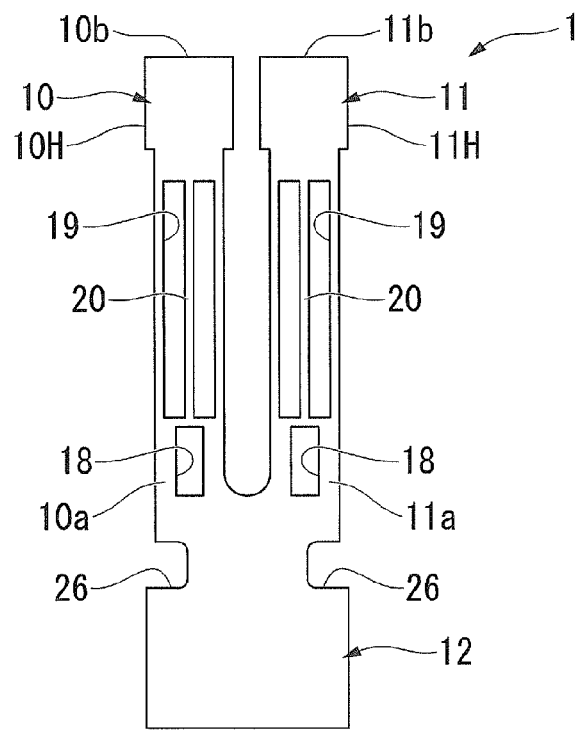
FIG. 8 is a drawing showing a sixth modification of the piezoelectric vibration reed, in which the width of distal end portions of the vibrating arm portions is enlarged.

As shown in FIG. 8, hammer portions 10H and 11H having an enlarged width in comparison with the proximal end portions 10a and 11a may be formed on the distal end portions 10b and 11b of the vibrating arm portions 10 and 11 (so-called, a hammer head type).

With the hammer portions 10H and 11H, the distal end portions 10b and 11b of the vibrating arm portions 10 and 11 may further be increased in weight, so that the inertia moment at the time of the vibrations may be increased. Therefore, the vibrations of the vibrating arm portions 10 and 11 may be facilitated, and hence the length of the vibrating arm portions 10 and 11 may be reduced correspondingly, so that further downsizing is easily achieved.

Seventh Modification of Embodiment

Figure 9:
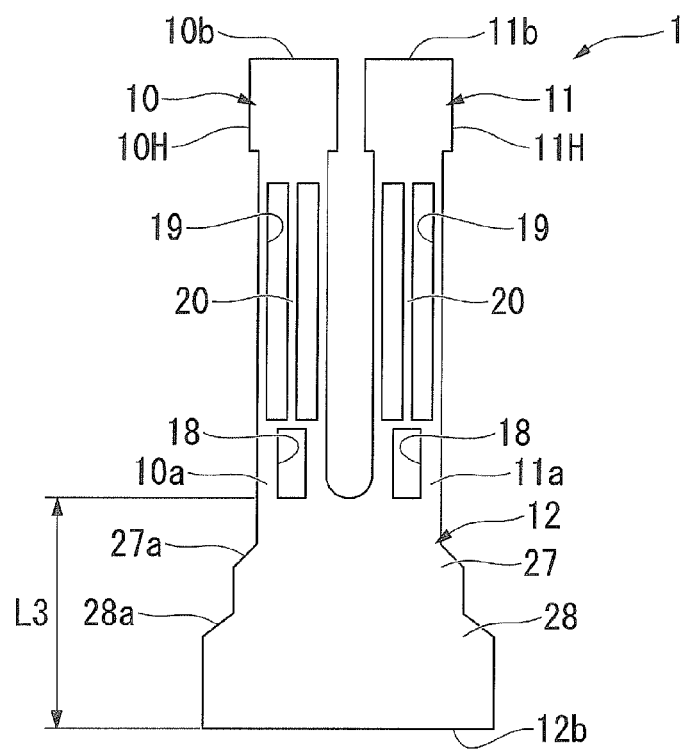
FIG. 9 is a drawing showing a seventh modification of the piezoelectric vibration reed, in which the width of the base portion is stepwise enlarged.

As shown in FIG. 9, the base portion 12 may be enlarged in step by step as it goes from the side of the connecting portions of the vibrating arm portions 10 and 11 with respect to the proximal end portions 10a and 11a toward another end portion 12b side.

More specifically, the base portion 12 in this modification includes a first base portion 27 on the side of the connecting portions and a second base portion 28 continuing from the first base portion 27 on the side of the other end portion 12b and increased in width with respect to the first base portion 27 (so-called, a two-shouldered base portion type). Connecting portions between the first base portion 27 and the proximal end portions 10a and 11a of the vibrating arm portions 10 and 11 and a connecting portion between the base portions 27 and 28 are formed respectively with inclined surfaces 27a and 28a gradually increased in width as it goes from the side of the connecting portions toward the other end portion 12b along the longitudinal direction.

In this configuration, a route through which the vibrations excited by the vibrating arm portions 10 and 11 are transmitted to the second base portion 28 side can be narrowed by the narrowed first base portion 27, so that the vibrations are locked on the side of the vibrating arm portions 10 and 11 and are easily inhibited from leaking toward the second base portion 28. Accordingly, the vibration leak can be effectively inhibited, and the CI value is prevented from increasing, whereby the deterioration of the quality of the output signal may be inhibited.

The mass of the base portion 12 can be increased without increasing a length L3 in the longitudinal direction connecting the connecting portions of the vibrating arm portions 10 and 11 with respect to the proximal end portions 10a and 11a and the other end portion 12b and, in addition, mounting utilizing the widened second base portion 28 is enabled. Therefore, the mounting properties are also improved.

Eighth Modification of Embodiment

Figure 10:
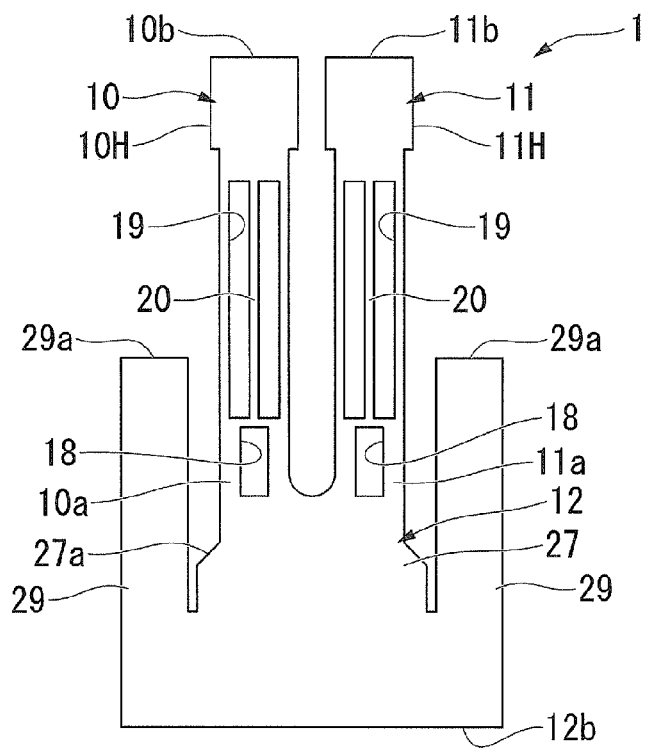
FIG. 10 is a drawing showing an eighth modification of the piezoelectric vibration reed, in which side arms are provided on the base portion.

As shown in FIG. 10, a pair of side arms 29 extending along the longitudinal direction on both sides in the width direction of the base portion 12 may be formed integrally with the base portion 12 (so-called, a side arm type).

More specifically, the respective side arms 29 extend from the other end portion 12b of the base portion 12 toward the both sides in the width direction and extend from outer side end portions toward the vibrating arm portions 10 and 11 along the longitudinal direction. In other words, the respective side arms 29 are positioned on the both sides in the width direction of the base portion 12 and the proximal end portions 10a and 11a of the vibrating arm portions 10 and 11, and distal end portions 29a are positioned of the side of the proximal end portions 10a and 11a of the groove portions 19 in the longitudinal direction.

In this case, the distal end portions 29a of the side arms 29 can be functioned as the mount portions, and mounting on the package, for example, via the mounting portion is enabled.

In this configuration, a long distance can be secured between the connecting portions of the vibrating arm portions 10 and 11 and the mount portions (the distal end portions 29a of the side arms 29) of the base portion 12. Consequently, the leak of the vibrations is inhibited without increasing the entire length of the piezoelectric vibration reed 1, and the CI value is inhibited from increasing, whereby the deterioration of the quality of the output signal may be inhibited.

Ninth Modification of Embodiment

Figure 11:
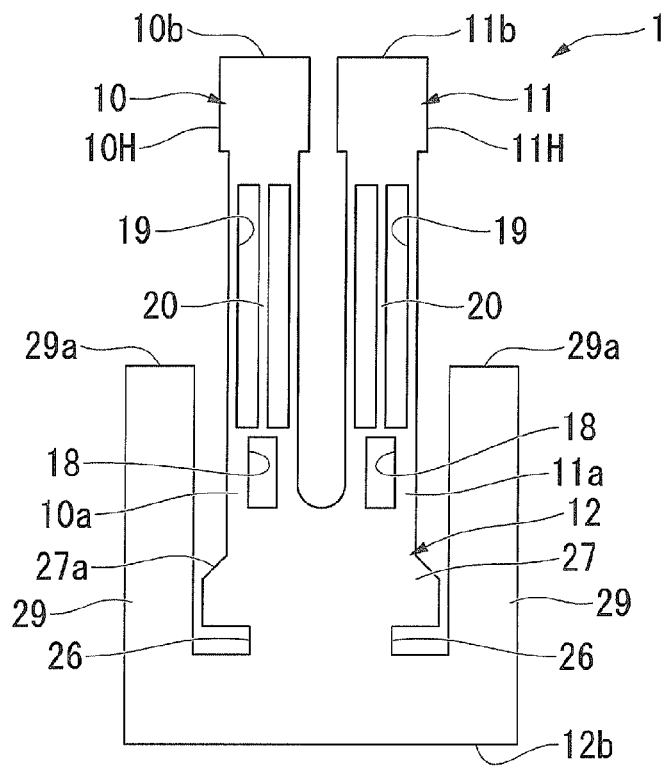
FIG. 11 is a ninth modification of the piezoelectric vibration reed, in which the notches and the side arms are provided on the base portion.

Furthermore, as shown in FIG. 11, the configuration in which the side arms 29 are provided shown in FIG. 10 (side arm type) and the configuration in which the notches 26 are formed on the base portion 12 shown in FIG. 7 (notch type) can be combined.

Accordingly, the vibration leak is reliably inhibited, and the CI value is inhibited from increasing, whereby the effect of inhibited the deterioration of the quality of the output signal is dominantly achieved.

Tenth Modification of Embodiment

Figure 12:
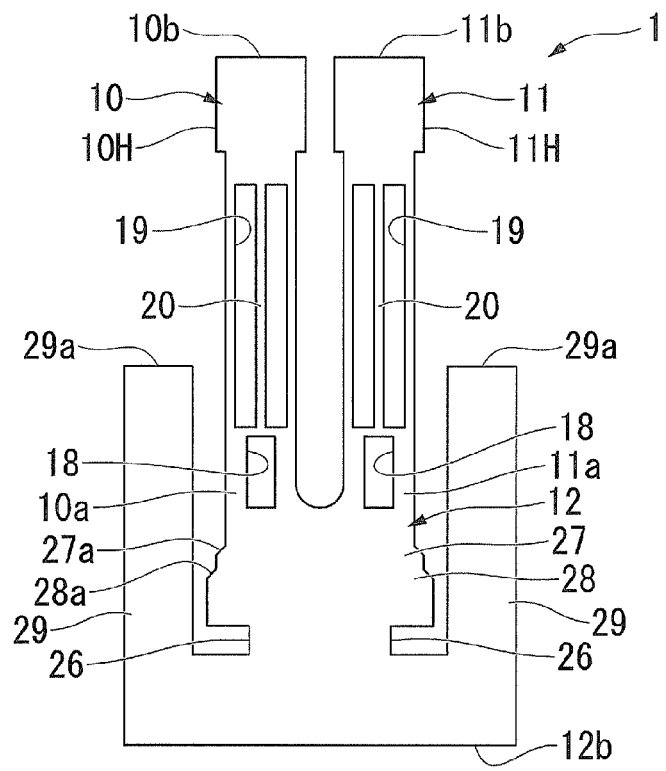
FIG. 12 is a tenth modification of the piezoelectric vibration reed, in which the notches, stepped portions, and side arms are provided on the base portion.

Furthermore, as shown in FIG. 12, the configuration in which the side arms 29 and the notches 26 are provided shown in FIG. 11 and the configuration in which the first base portion 27 and the second base portion 28 are formed on the base portion 12 shown in FIG. 9 (double-shouldered base portion type) can be combined.

Accordingly, the leak of the vibrations is reliably inhibited, and the CI value is inhibited from increasing, whereby the effect of inhibiting the deterioration of the quality of the output signal is further dominantly achieved.

(Piezoelectric Vibrator)

Subsequently, a piezoelectric vibrator 30 using the piezoelectric vibration reed 1 according to the embodiment described above will be described. Here, a case where the piezoelectric vibration reed 1 shown in FIG. 12 is used as the piezoelectric vibration reed 1 will be described as an example. However, the invention is not limited to the piezoelectric vibration reed 1 in this case and other types of the piezoelectric vibration reeds may be used.

As shown in FIG. 13 to FIG. 16, the piezoelectric vibrator 30 in this embodiment is of a surface-mounted type including a package P in which a base substrate 31 and a lid substrate 32 are joined by, for example, anode joining or joined via a joint film or the like, not shown, and the piezoelectric vibration reed 1 accommodated in a cavity C formed in the interior of the package P.

The base substrate 31 and the lid substrate 32 are transparent insulative substrates formed of a glass material, for example, a soda-lime glass, and is formed into a substantially plate shape. The lid substrate 32 is formed with a rectangular depression 32a for accommodating the piezoelectric vibration reed 1 on the side of a joint surface where the base substrate 31 is joined. The depression 32a defines the cavity C for accommodating the piezoelectric vibration reed 1 when the base substrate 31 and the lid substrate 32 are stacked one on top of another.

The base substrate 31 is formed with a pair of through holes 33 and 34 configured to penetrate the base substrate 31 in the thickness direction. The through holes 33 and 34 are formed at positions accommodated within the cavity C. More specifically, the through holes 33 and 34 in the embodiment described above are such that the one through hole 33 is formed at a position corresponding to the base portion 12 of the piezoelectric vibration reed 1 mounted thereon and the other through hole 34 is formed at a position corresponding to the distal end sides of the vibrating arm portions 10 and 11.

Then, a pair of through electrodes 35 and 36 are formed in the pair of through holes 33 and 34 so as to be embedded therein. The through electrodes 35 and 36 are conductive core members fixed integrally with the through holes 33 and 34, for example, and are formed so as to be flat at both ends thereof and have the substantially same thickness as the thickness of the base substrate 31. Accordingly, the electric conductivity is secured on both surfaces of the base substrate 31 while maintaining air-tightness in the cavity C.

The through electrodes 35 and 36 are not limited to the case described above, and may be formed, for example, by inserting metal pins, not shown, in the through holes 33 and 34, and then filling glass frit between the through holes 33 and 34 and the metal pins and sintering the same. Furthermore, a conductive adhesive agent embedded in the through holes 33 and 34 is also applicable.

A pair of drawing electrodes 38 and 39 are patterned using a conductive material on an upper side (the side of a joint surface to which the lid substrate 32 is joined) of the base substrate 31. The drawing electrode 38, which is the one of the pair of drawing electrodes 38 and 39, covers the through electrode 35 at one end side, and extends on the other end side toward a center portion of the base substrate 31 in the longitudinal direction. The other drawing electrode 39 covers the through electrode 36 at one end side, and extends on the other end side toward the center portion of the base substrate 31 in the longitudinal direction. Therefore, the other end sides of the respective drawing electrodes 38 and 39 are arranged at the same positions of the base substrate 31 in the longitudinal direction, more specifically, at positions corresponding to the distal end portions 29a of the side arms 29 of the piezoelectric vibration reed 1.

Then, bumps B formed of gold or the like respectively are formed at the other end sides of the pair of drawing electrodes 38 and 39. The piezoelectric vibration reed 1 is mounted in a state in which the mount electrode of the base portion 12 is in contact with the bumps B. Accordingly, the piezoelectric vibration reed 1 is supported in a state of coming off an upper surface of the base substrate 31, and is in a state of electrically connected to the respective drawing electrodes 38 and 39.

In this embodiment, the mount electrode is formed on the distal end portions 29a of the side arms 29, and the mount electrode is connected to the drawing electrodes 38 and 39 via the bumps B.

Figure 13:
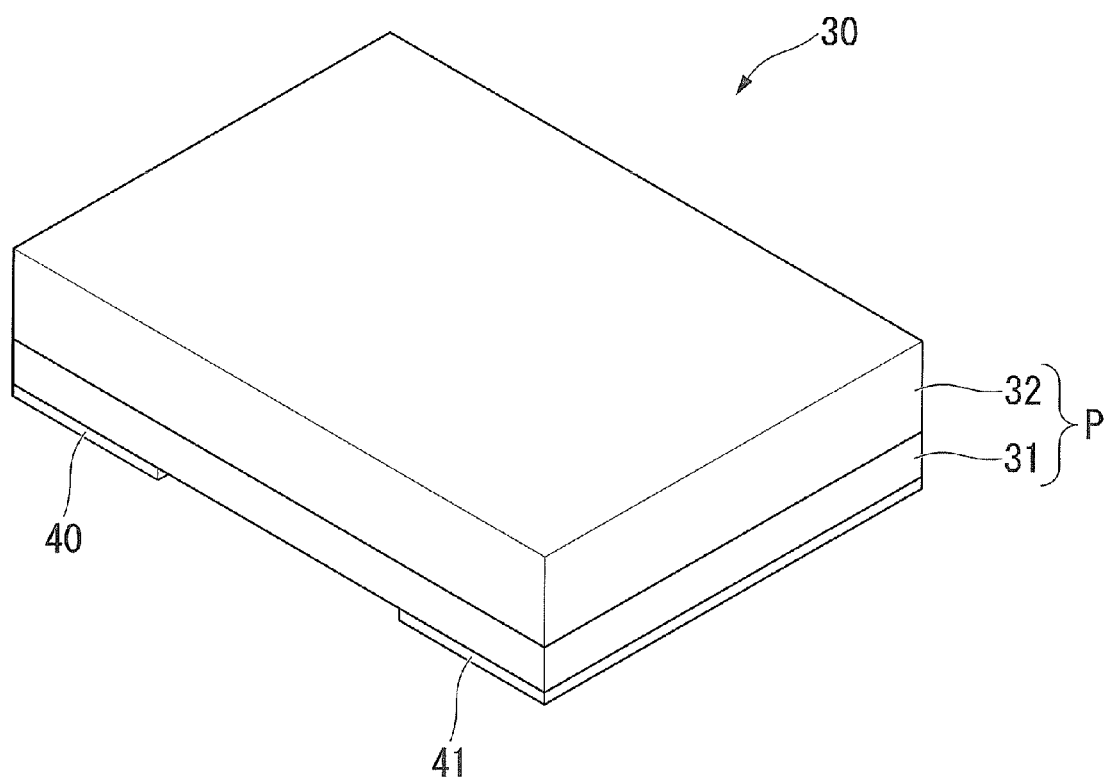
FIG. 13 is an appearance perspective view showing an embodiment of a piezoelectric vibrator according to the invention.
Figure 14:
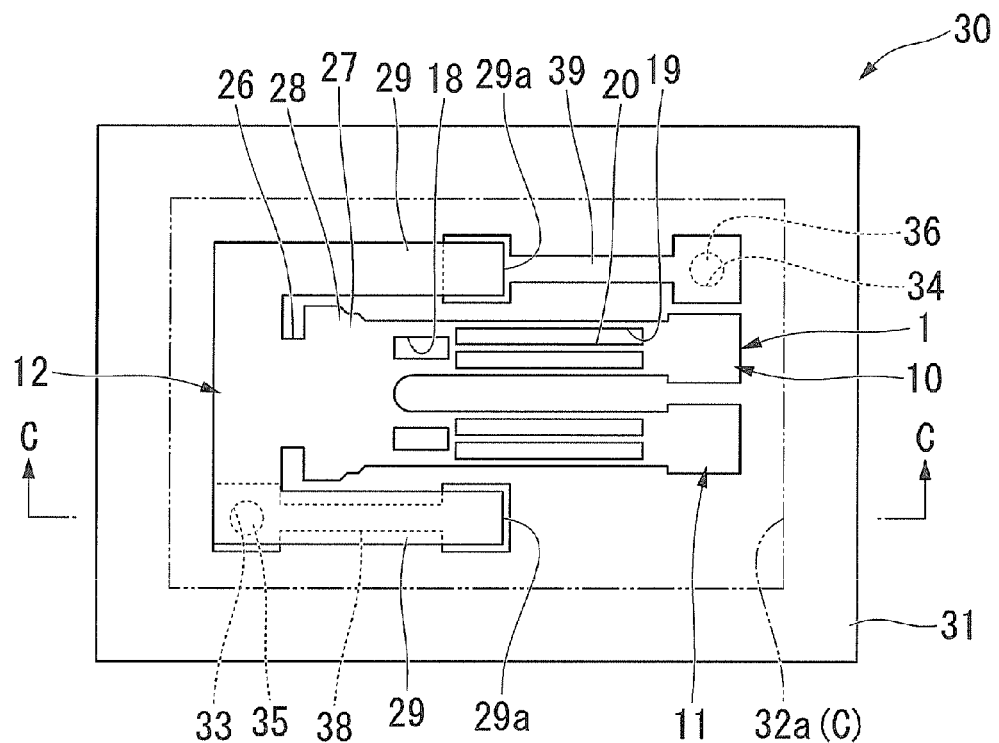
FIG. 14 is an internal configuration drawing of the piezoelectric vibrator shown in FIG. 13, in which the piezoelectric vibration reed is viewed from above in a state in which a lid substrate is removed.
Figure 15:
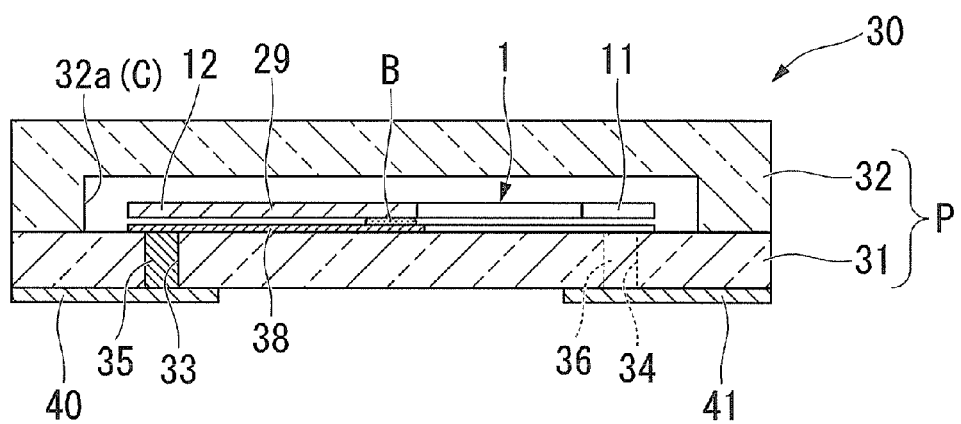
FIG. 15 is a cross-sectional view of the piezoelectric vibrator taken along the line C-C in FIG. 14.
Figure 16:
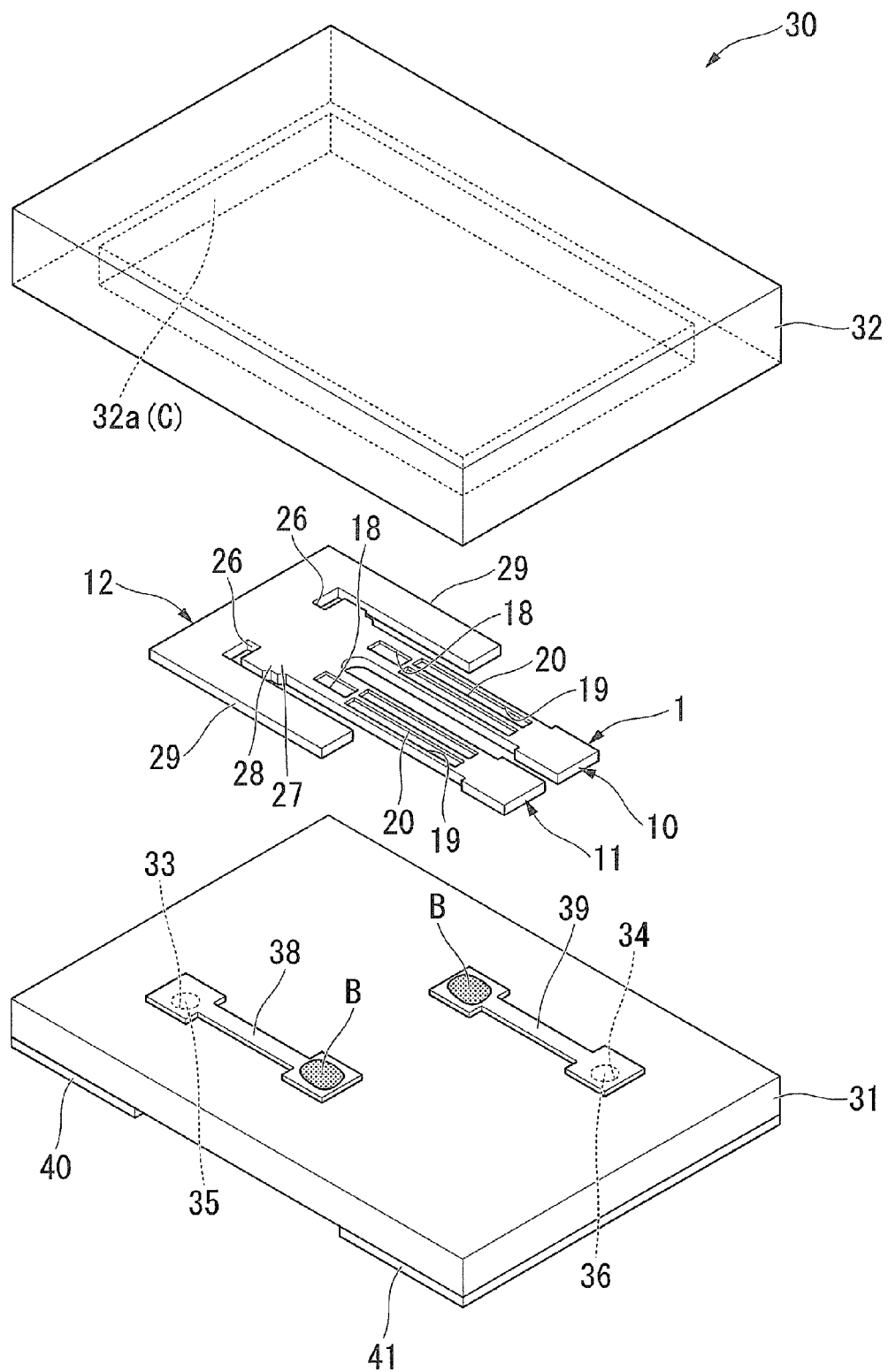
FIG. 16 is an exploded perspective view of the piezoelectric vibrator shown in FIG. 13.

As shown in FIGS. 13, 15, and 16, external electrodes 40 and 41 to be electrically connected respectively to the pair of through electrodes 35 and 36 are formed on a lower surface of the base substrate 31.

When activating the piezoelectric vibrator 30 configured in this manner, a predetermined drive voltage is applied to the external electrodes 40 and 41 formed on the base substrate 31. Accordingly, a current is passed through the excitation electrode of the piezoelectric vibration reed 1, so that the pair of vibrating arm portions 10 and 11 may be vibrated in the direction toward and away from each other at a predetermined frequency. Then, the piezoelectric vibrator 30 may be used as a time-of-day source, a timing source of a control signal, or a reference signal source using the vibrations of the pair of vibrating arm portions 10 and 11.

According to the piezoelectric vibration reed 1 configured as described above, since the CI value may be reduced while ensuring a high strength after having achieved the downsizing. Therefore, when the piezoelectric vibration reed 1 as described above is mounted in the cavity C, high reliability and high vibration properties are achieved while downsizing the piezoelectric vibrator 30.

(Oscillator)

Subsequently, an embodiment of the oscillator according to the invention will be described with reference to FIG. 17.

Figure 17:
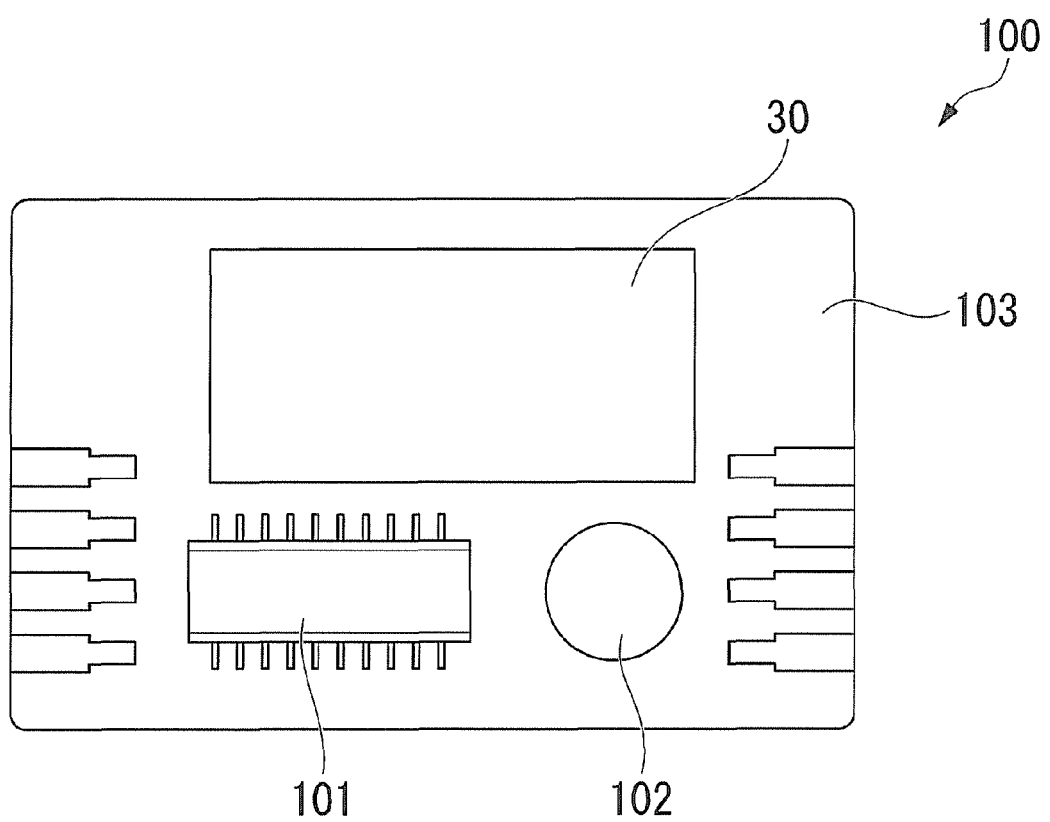
FIG. 17 is a configuration drawing showing an embodiment of an oscillator according to the invention.

An oscillator 100 in this embodiment includes the piezoelectric vibrator 30 configured as an oscillating element electrically connected to an integrated circuit 101 as shown in FIG. 17. The oscillator 100 includes a substrate 103 on which an electronic component 102 such as a capacitor is mounted. The substrate 103 includes the integrated circuit 101 described above for the oscillator mounted thereon, and the piezoelectric vibrator 30 is mounted in the vicinity of the integrated circuit 101. The electronic component 102, the integrated circuit 101, and the piezoelectric vibrator 30 are electrically connected respectively by a wiring pattern, not shown. The respective components are molded by a resin, not shown.

In the oscillator 100 configured in this manner, when a voltage is applied to the piezoelectric vibrator 30, the piezoelectric vibration reed 1 in the piezoelectric vibrator 30 vibrates. This vibration is converted into an electric signal by the piezoelectric property of the piezoelectric vibration reed 1, and is input to the integrated circuit 101 as the electric signal. The input electric signal is subjected to various processes by the integrated circuit 101 and is output as a frequency signal. Accordingly, the piezoelectric vibrator 30 functions as an oscillating element.

In addition, by selectively setting the configuration of the integrated circuit 101, that is, RTC (Real Time Clock) modules according to the request, in addition to the function of a single-function oscillator for a time piece, a function to control the date and time of operation of the single-function oscillator for a time piece or external instruments or a function to provide the time of day or a calendar may be added.

As described above, according to the oscillator 100 in this embodiment, since the downsized piezoelectric vibrator 30 having advanced performance which is capable of inhibiting the CI value to a low level while providing a high strength is provided, the oscillator 100 having the high reliability and high performance can be provided.

(Electronic Instrument)

Figure 18:
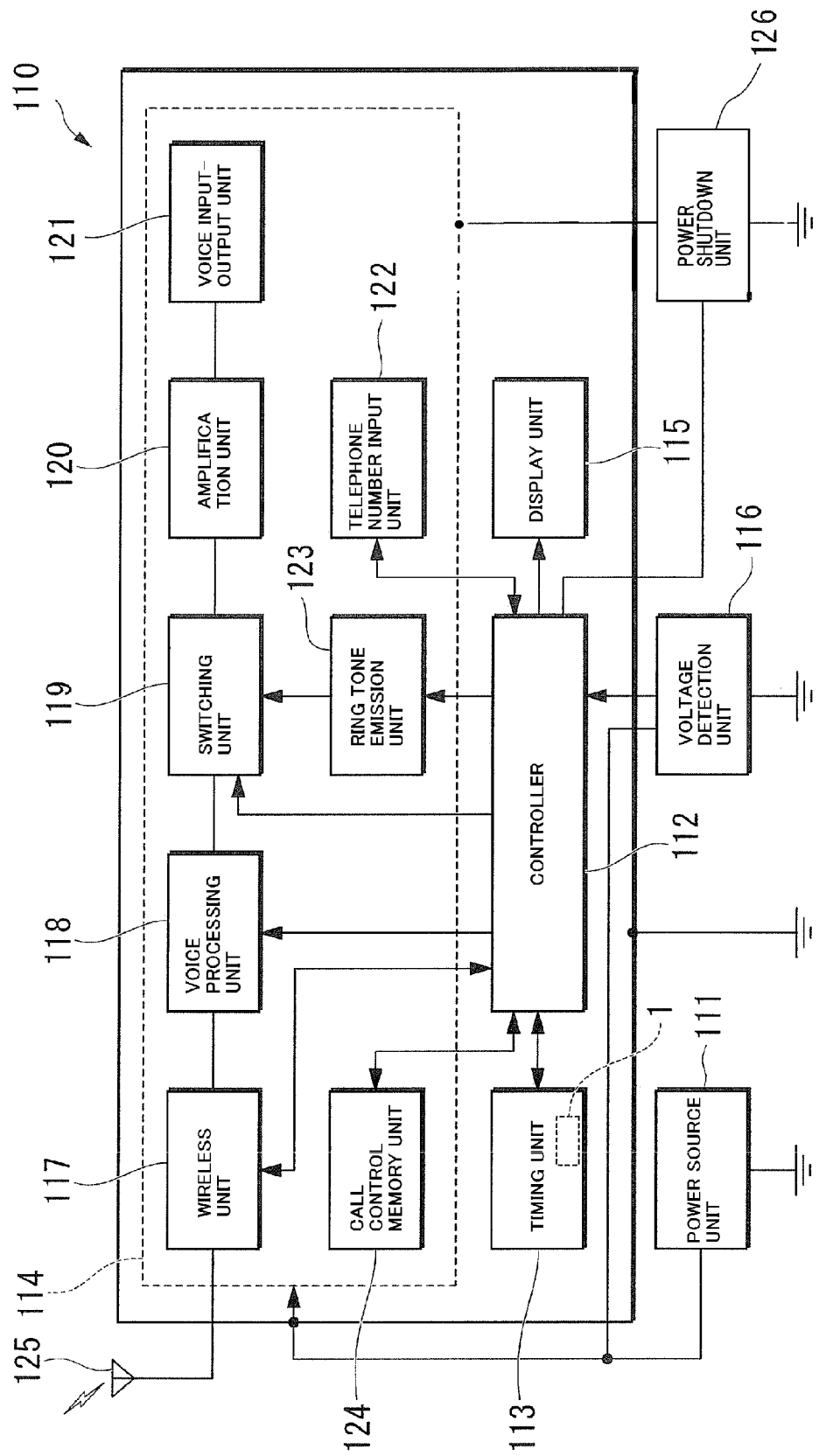
FIG. 18 is a configuration drawing showing an embodiment of an electronic instrument according to the invention.

Referring now to FIG. 18, an embodiment of the electronic instrument according to the invention will be described. A portable digital assistant device (electronic instrument) 110 having the piezoelectric vibrator 30 described above as the electronic instrument will be described as an example.

The portable digital assistant device 110 in this embodiment is represented, for example, by a mobile phone, which is a developed and improved wrist watch of the related art. An appearance is similar to the wrist watch, including a liquid crystal display at a portion corresponding to a dial, which is configured to display current time or the like on a screen thereof. When used as a communication instrument, the same communication as the mobile phones of the related art may be performed by removing the same from the wrist and using a speaker and a microphone integrated in a potion inside a band. However, downsizing and reduction in weight are dramatically achieved in comparison with the mobile phones of the related art.

Subsequently, a configuration of the portable digital assistant device 110 of this embodiment will be described. The portable digital assistant device 110 includes the piezoelectric vibrator 30 and a power source unit 111 configured to supply power as shown in FIG. 18. The power source unit 111 is formed of, for example, a lithium secondary cell. The power source unit 111 includes a control unit 112 configured to perform various types of control, a clocking unit 113 configured to count time of day or the like, a communication unit 114 configured to perform communication with the outside, a display unit 115 configured to display various items of information, and a voltage detection unit 116 configured to detect voltage of the respective functional portions connected in parallel to each other. Then, the power is supplied to the respective functional portions by the power source unit 111.

The control unit 112 performs sending and receiving of voice data, counting and display of the current time of day, and control of the operation of the entire system by controlling the respective functional portions. The control unit 112 includes an ROM in which a program is written in advance, a CPU configured to read out and execute the program written in the ROM, and an RAM used as a work area for the CPU.

The clocking unit 113 includes an integrated circuit having an oscillation circuit, a register circuit, a counter circuit, and an interface circuit integrated therein, and the piezoelectric vibrator 30. When a voltage is applied to the piezoelectric vibrator 30, the piezoelectric vibration reed 1 vibrates, and the vibration thereof is converted into an electric signal by the piezoelectric property of crystal, and is input to the oscillation circuit as the electric signal. The output of the oscillation circuit is binarized and is counted by the register circuit and the counter circuit. Then, sending and receiving of the signal with respect to the control unit 112 is performed via the interface circuit, and the current time of day, the current date, calendar information or the like are displayed on the display unit 115.

The communication unit 114 has the same function as the mobile phones of the related art, and includes a wireless unit 117, a voice processing unit 118, a switch unit 119, an amplifying unit 120, a voice input/output unit 121, a phone number input unit 122, a ring tone generating unit 123, and a call control memory unit 124.

The wireless unit 117 performs sending and receiving of various types of data such as voice data with respect to a base station via an antenna 125. The voice processing unit 118 codes and decodes the voice signal input from the wireless unit 117 or the amplifying unit 120. The amplifying unit 120 amplifies the signal input from the voice processing unit 118 or the voice input/output unit 121 to a predetermined level. The voice input/output unit 121 is formed of a speaker, a microphone, or the like, and in configured to amplify a ring tone or a receiving voice, or collect a voice.

The ring tone generating unit 123 generates the ring tone according to a call from the base station. The switch unit 119 switches the amplifying unit 120 connected to the voice processing unit 118 to the ring tone generating unit 123 only at the time of incoming call, so that the ring tone generated by the ring tone generating unit 123 is output to the voice input/output unit 121 via the amplifying unit 120.

The call control memory unit 124 stores a program relating to control of incoming and outgoing call of communication. The phone number input unit 122 includes, for example, numerical key from 0 to 9 and other keys, and is configured to input a telephone number of the called party by pushing these numerical key or the like.

The voltage detection unit 116 detects voltage drop when the voltage applied to the receptive functional portions such as the control unit 112 by the power source unit 111, and notifies the same to the control unit 112. The predetermined voltage value at this time is a value preset as a minimum required voltage for keeping a stable operation of the communication unit 114 and, for example, on the order of 3 V. The control unit 112 which receives the notification of the voltage drop from the voltage detection unit 116 prohibits the wireless unit 117, the voice processing unit 118, the switch unit 119, and the ring tone generating unit 123 from operating. In particular, the stop of the operation of the wireless unit 117 which consumes a large amount of power is essential. Then, the effect that the communication unit 114 is disabled due to insufficient remaining battery power is displayed on the display unit 115.

In other words, the operation of the communication unit 114 is prohibited by the voltage detection unit 116 and the control unit 112, and that effect may be displayed on the display unit 115. This display may be a literal message. However, as more intuitive display, a cross mark (x) may be shown on a phone icon displayed on an upper portion of a display surface of the display unit 115.

With the provision of a power source blocking unit 126 which is capable of selectively blocking the electric power of a portion relating to the function of the communication unit 114, the function of the communication unit 114 may be stopped further reliably.

As described above, according to the portable digital assistant device 110 in this embodiment, since the downsized piezoelectric vibrator 30 having an advanced performance which is capable of suppressing the CI value to a low level while providing a high strength is provided, the portable digital assistant device 110 having high reliability and high performance can be provided.

(Radio Timepiece)

Figure 19:
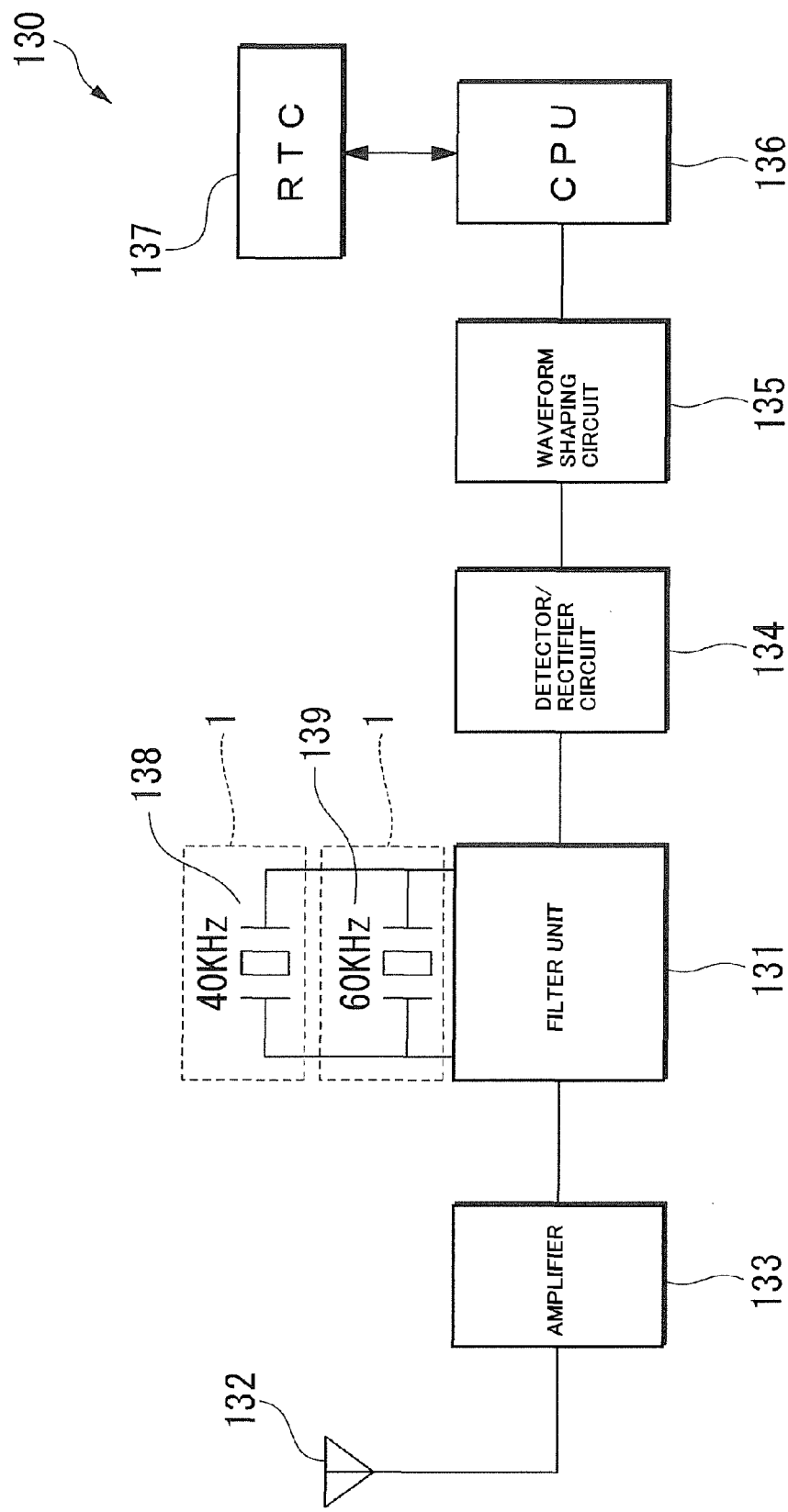
FIG. 19 is a configuration drawing showing an embodiment of a radio timepiece according to the invention.

Referring now to FIG. 19, an embodiment of a radio timepiece according to the invention will be described.

A radio timepiece 130 in this embodiment includes the piezoelectric vibrator 30 electrically connected to a filter 131 as shown in FIG. 19, and is a timepiece having a function to receive standard radio waves including timepiece information and display an accurate time-of-day automatically corrected.

In Japan, there are two transmitting stations (transmitter stations) which transmit standard radio waves in Fukushima prefecture (40 kHz) and Saga prefecture (60 kHz), and transmit respective standard radio waves. Since long waves such as 40 kHz or 60 kHz have both a property to propagate the ground surface and a property to propagate while being reverberate between an ionization layer and the ground surface, a wide range of the propagation is achieved, so that the above-described two transmitting stations cover entire part of Japan.

Hereinafter, a functional configuration of the radio timepiece 130 will be described in detail.

An antenna 132 receives a long standard radio wave of 40 kHz or 60 kHz. The long standard radio wave is time information referred to as time code subjected to an AM modulation to a carrier wave of 40 kHz or 60 kHz. The received long standard radio wave is amplified by an amplifier 133 and is filtered and synchronized by the filter 131 having a plurality of the piezoelectric vibrators 30.

The piezoelectric vibrators 30 in this embodiment include quartz vibrator units 138 and 139 having resonant frequencies of 40 kHz and 60 kHz which are the same as the above-described carrier frequencies, respectively.

In addition, a signal filtered and having a predetermined frequency is subjected to detection and demodulation by a detection and rectification circuit 134.

Subsequently, the time code is acquired via a waveform shaping circuit 135, and is counted by a CPU 136. The CPU 136 reads information such as the current year, day of year, day of the week, time of day, and the like. The read information is reflected on an RTC 137, and a correct time of day information is displayed.

Since the carrier wave has 40 kHz or 60 kHz, vibrators having the above-described tuning-fork-type structure is suitable for the quartz vibrator units 138 and 139.

The above-described description is based on an example in Japan, and the frequencies of the long standard radio waves are different in foreign countries. For example, in Germany, a standard radio wave of 77.5 kHz is used. Therefore, when integrating the radio timepiece 130 which is compatible with foreign countries in mobile apparatuses, another piezoelectric vibrator 30 having a frequency different from that in Japan is required.

As described above, according to the radio timepiece 130 in this embodiment, since the downsized piezoelectric vibrator 30 having advanced performance which is capable of inhibiting the CI value to a low level while providing a high strength is provided, the radio timepiece 130 having the high reliability and the high performance is provided.

Although the embodiments of the invention have been described in detail referring to the drawings, detailed configurations are not limited to these embodiments, and modifications in design without departing the scope of the invention are also included.

For example, in the embodiments described above, the piezoelectric vibration reed 1 in the invention is employed as the surface-mounted piezoelectric vibrator 30. However, the invention is not limited thereto, and the piezoelectric vibration reed 1 of the invention may be used for the piezoelectric vibrator of a cylinder package type.

In addition, the configurations described above may be sorted out or may be changed to other configurations as needed without departing the scope of the invention.

What is claimed is:

1. A piezoelectric vibration reed comprising:
a pair of vibrating arm portions extending in parallel to each other; and
a base portion integrally fixing proximal end portions in a longitudinal direction of the pair of vibrating arm portions,
wherein:
the pair of vibrating arm portions have first groove portions on a main surface at a side of the proximal end portions and second groove portions on a side of distal end portions of the vibrating arm portions with respect to the first groove portions,
a width of the first groove portions in a direction orthogonal to the longitudinal direction of the vibrating arm portions on the main surfaces of the vibrating arm portions is smaller than a width of the second groove portions, and
a reinforcing rib projects from a bottom surface of the second groove portions, and
each of the first and second vibrating arm portions further comprise a partitioning wall separating the first groove and the second groove, the partitioning wall inclined from an end of the vibrating arm portion coupled with the base portion towards an opposing end of the vibrating arm portion.

2. The piezoelectric vibration reed of claim 1, wherein the first groove portions have a length in the longitudinal direction of the vibrating arm portions that is less than a length of the second groove portions in the longitudinal direction.

3. The piezoelectric vibration reed of claim 1, wherein the first groove portions and the second groove portions extend in the longitudinal direction of the vibrating arm portions.

4. The piezoelectric vibration reed of claim 1, wherein the reinforcing ribs extend in the longitudinal direction of the vibrating arm portions in the second groove portions so as to connect ends thereof on the side of the proximal end portions of the vibrating arm portions and opposite ends on the side of the distal end portions of the vibrating arm portions.

5. The piezoelectric vibration reed of claim 1, wherein the reinforcing ribs intermittently extend in the longitudinal direction of the vibrating arm portions in the second groove portions.

6. The piezoelectric vibration reed of claim 1, wherein the reinforcing ribs extend in the width direction in the second groove portions so as to bridge the second groove portions in the width direction of the vibrating arm portions.

7. A piezoelectric vibration reed comprising:
a base portion; and
a first vibrating arm portion and a second vibrating arm portion, each integrally connected with the base portion and extending from the base portion in parallel to each other in a first direction, wherein each of the first and second vibrating arm portions comprise:
a first groove in a first section of the vibrating arm portion and extending in the first direction;
a second groove in a second section of the vibrating arm portion extending in the first direction, wherein the first groove is located between the second groove and an end of the vibrating arm portion coupled with the base portion, and
wherein the second groove comprises a reinforcing rib projecting from a bottom surface of the second groove portion and extending from one end of the second groove to an opposite end of the second groove in the first direction, and wherein each of the first and second vibrating arm portions further comprise a partitioning wall separating the first groove and the second groove, the partitioning wall inclined from an end of the vibrating arm portion connected to the base portion towards an opposing end of the vibrating arm portion.

8. The piezoelectric vibration reed of claim 7, wherein the first groove has a width in a direction orthogonal to the first direction that is less than a width of the second groove.

9. The piezoelectric vibration reed of claim 7, wherein the second groove comprises two sections separated by the reinforcing rib.

10. The piezoelectric vibration reed of claim 7, wherein the first groove has a length in the first direction that is smaller than a length of the second groove in the first direction.

11. The piezoelectric vibration reed of claim 7, wherein the first groove extends from the end of the vibrating arm portion coupled with the base portion towards the second groove.

12. A piezoelectric vibration reed, comprising:
a base portion; and
a pair of vibrating arm portions, each integrally connected with the base portion and extending from the base portion in parallel to each other in a first direction, wherein each of the vibrating arm portions comprise:
a first groove in a first section of the vibrating arm portion and extending in the first direction;
a second groove in a second section of the vibrating arm portion extending in the first direction, wherein the first groove is located between the second groove and an end of the vibrating arm portion coupled with the base portion, wherein the second groove includes a reinforcing rib projecting from a bottom surface of the second groove portion that separates the second groove into two sections, and wherein each of the first and second vibrating arm portions further comprise a partitioning wall separating the first groove and the second groove, the partitioning wall inclined from an end of the vibrating arm portion connected to the base portion towards an opposing end of the vibrating arm portion.

13. The piezoelectric vibration reed of claim 12, wherein the first groove has a length in the first direction that is smaller than a length of the second groove in the first direction.

14. The piezoelectric vibration reed of claim 12, wherein the first groove extends from an end of the vibrating arm portion coupled with the base portion towards the second groove.

* * * * *